(12) United States Patent
Mizuno et al.

(10) Patent No.: US 11,977,155 B2
(45) Date of Patent: May 7, 2024

(54) DISTANCE MEASUREMENT APPARATUS HAVING AN INTERPOLATION PROCESSOR

(71) Applicant: DENSO CORPORATION, Kariya (JP)

(72) Inventors: Tamotsu Mizuno, Kariya (JP); Mitsuo Nakamura, Kariya (JP)

(73) Assignee: DENSO CORPORATION, Kariya (JP)

( * ) Notice: Subject to any disclaimer, the term of this patent is extended or adjusted under 35 U.S.C. 154(b) by 939 days.

(21) Appl. No.: 16/991,462

(22) Filed: Aug. 12, 2020

(65) Prior Publication Data

US 2020/0371236 A1 Nov. 26, 2020

Related U.S. Application Data

(63) Continuation of application No. PCT/JP2019/005136, filed on Feb. 13, 2019.

(30) Foreign Application Priority Data

Feb. 15, 2018 (JP) .................................. 2018-025072

(51) Int. Cl.
*G01S 17/10* (2020.01)
*G01S 7/481* (2006.01)
(Continued)

(52) U.S. Cl.
CPC ............ *G01S 17/10* (2013.01); *G01S 7/4817* (2013.01); *G01S 7/4861* (2013.01);
(Continued)

(58) Field of Classification Search
CPC ...... G01S 17/10; G01S 7/4817; G01S 7/4861; G01S 7/4865; H03H 17/00; H03M 1/124; H03M 1/202
(Continued)

(56) References Cited

U.S. PATENT DOCUMENTS 4,535,357 A * 8/1985 Penney ................ H04N 5/0675
386/207
6,115,113 A * 9/2000 Flockencier .......... G01S 7/4812
356/5.01
(Continued)

FOREIGN PATENT DOCUMENTS

EP 2157695 B1 * 1/2014 ......... H03H 17/0671
JP 4-318700 A 11/1992
(Continued)

OTHER PUBLICATIONS

J. Brown, C. Hughes and L. DeBrunner, "Real-time hardware design for improving laser detection and ranging accuracy," 2012 Conference Record of the Forty Sixth Asilomar Conference on Signals, Systems and Computers (ASILOMAR), Pacific Grove, CA, USA, 2012, pp. 1115-1119 (Year: 2012).*

*Primary Examiner* — Michelle M Iacoletti
*Assistant Examiner* — Noah J. Haney
(74) *Attorney, Agent, or Firm* — MASCHOFF BRENNAN

(57) ABSTRACT

In a distance measurement apparatus, a light emitter emits pulse-like light. A light receiver receives reflected light of the emitted light and converts the received light to an electrical signal. An AD converter converts the electrical signal to a digital value at a predetermined sampling rate to generate a conversion data series. An interpolation processor upsamples the outputted conversion data series by inserting interpolation data therein to generate an up-data series. A distance calculator calculates a distance to an object that reflects light using a signal waveform indicated by the up-data series. The interpolation processor inserts the interpolation data having an interpolation value between pieces of data belonging to the conversion data series, and smooths the data series in which the interpolation data is inserted (Continued)

using a low-pass filter that has characteristics in which waveform distortion caused by ringing does not occur.

17 Claims, 13 Drawing Sheets

(51) Int. Cl.
| | |
|---|---|
| *G01S 7/4861* | (2020.01) |
| *G01S 7/4865* | (2020.01) |
| *H03H 17/00* | (2006.01) |
| *H03M 1/12* | (2006.01) |
| *H03M 1/20* | (2006.01) |

(52) U.S. Cl.
CPC ........... *G01S 7/4865* (2013.01); *H03H 17/00* (2013.01); *H03M 1/124* (2013.01); *H03M 1/202* (2013.01)

(58) Field of Classification Search
USPC .......................................................... 356/3
See application file for complete search history.

(56) References Cited

U.S. PATENT DOCUMENTS

| | | | | |
|---|---|---|---|---|
| 8,619,241 | B2* | 12/2013 | Mimeault | G01S 7/4865 |
| | | | | 356/3.01 |
| 9,335,403 | B2* | 5/2016 | Lewis | G01S 7/4915 |
| 9,599,713 | B2* | 3/2017 | Giger | G01S 7/483 |
| 10,120,077 | B2* | 11/2018 | Stutz | H03M 1/1245 |
| 2010/0135368 | A1* | 6/2010 | Mehta | H03H 17/0671 |
| | | | | 708/313 |
| 2016/0349368 | A1 | 12/2016 | Stutz et al. | |
| 2017/0242108 | A1* | 8/2017 | Dussan | G01S 7/4868 |
| 2017/0363740 | A1* | 12/2017 | Kubota | G01S 7/484 |
| 2018/0259629 | A1* | 9/2018 | Oohata | G01S 17/10 |
| 2018/0284241 | A1* | 10/2018 | Campbell | G01S 7/4865 |

FOREIGN PATENT DOCUMENTS

| | | | |
|---|---|---|---|
| JP | H08-079558 A | 3/1996 | |
| JP | 2002271431 A * | 9/2002 | ............ H03H 17/02 |
| JP | 2006-081168 A | 3/2006 | |
| JP | 2015-169643 A | 9/2015 | |
| JP | 2017-003489 A | 1/2017 | |
| KR | 10-2017-0011906 A | 2/2017 | |

* cited by examiner

DISTANCE MEASUREMENT APPARATUS HAVING AN INTERPOLATION PROCESSOR

CROSS-REFERENCE TO RELATED APPLICATIONS

The present application is a continuation application of International Application No. PCT/JP2019/005136, filed Feb. 13, 2019, which claims priority to Japanese Patent Application No. 2018-025072, filed Feb. 15, 2018. The contents of these applications are incorporated herein by reference in their entirety.

BACKGROUND

Technical Field

The present disclosure relates to a technology for improving distance detection accuracy of a distance measurement apparatus.

Related Art

As a distance measurement apparatus, a known lidar apparatus that performs scanning with light and detects a distance to an object that reflects the light is known. In the lidar apparatus, a process for detecting a peak in a waveform and the like are performed using analog-to-digital (AD) conversion data that is obtained by AD conversion being performed on a light reception signal.

SUMMARY

An aspect of the present disclosure provides a distance measurement apparatus that includes a light emitter, a light receiver, a scanner, an analog-to-digital (AD) converter, an interpolation processor, and a distance calculator. The light emitter emits pulse-like light. The light receiver receives reflected light of the light emitted by the light emitter and converts the received light to an electrical signal. The AD converter converts the electrical signal outputted from the light receiver to a digital value at a predetermined sampling rate to generate a conversion data series. The interpolation processor upsamples the conversion data series outputted by the AD converter by inserting interpolation data therein to generate an up-data series. The distance calculator calculates a distance to an object that reflects light using a signal waveform that is indicated by the up-data series generated by the interpolation processor. The interpolation processor inserts the interpolation data having a predetermined interpolation value between pieces of data belonging to the conversion data series, and smooths the data series in which the interpolation data is inserted using a low-pass filter that has characteristics in which waveform distortion caused by ringing does not occur.

DESCRIPTION OF THE EMBODIMENTS

Figure 1:
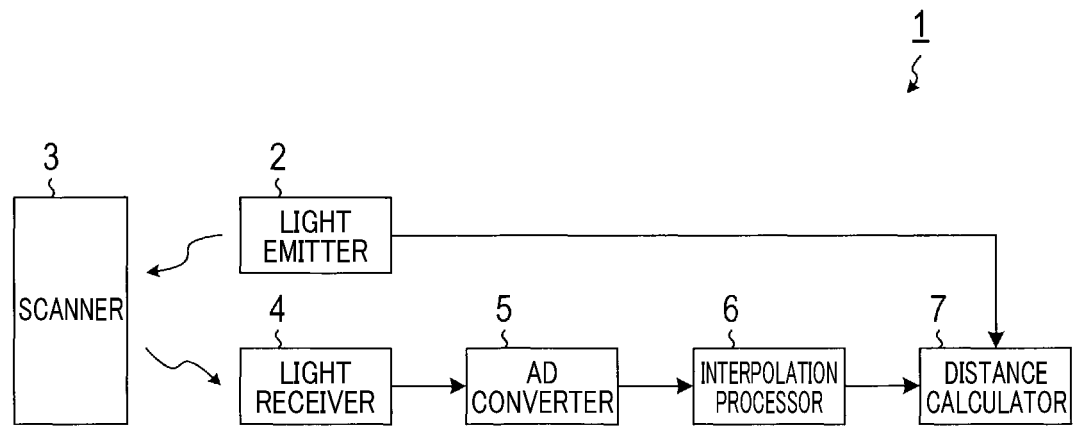
FIG. 1 is a block diagram illustrating a configuration of a distance measurement apparatus.

As a distance measurement apparatus, a lidar apparatus that performs scanning with light and detects a distance to an object that reflects the light is known. Here, lidar is also referred to as LIDAR and is an abbreviation of Light Detection and Ranging.

In the lidar apparatus, a process for detecting a peak in a waveform and the like are performed using analog-to-digital (AD) conversion data that is obtained by AD conversion being performed on a light reception signal. Here, as a sampling rate of AD conversion increases, the AD conversion data becomes more able to accurately reproduce a waveform of the light reception signal. As a result, detection accuracy regarding a peak position in a waveform and, further, detection accuracy regarding a distance to an object are improved.

However, a high-speed AD converter has issues in which the high-speed AD converter is expensive and large in size, has high power consumption, high heat generation, and high noise, and the like. Here, a technology referred to as upsampling that improves the sampling rate by a process after AD conversion using a relatively low-speed AD converter is known. In upsampling, a zero value is inserted into the AD conversion data. Smoothing is performed using a low-pass filter (hereafter, LPF), and data is thereby interpolated. To improve reproduction of the waveform of the light reception signal by a data series after upsampling, the LPF preferably has sharp cutoff characteristics similar to a high-order finite impulse response (FIR) filter.

Here, in the lidar apparatus, a dynamic range of an amount of input light is wide. Therefore, a circuit that performs analog processing of the light reception signal may become saturated. In this case, the waveform of the light reception signal becomes a saturated waveform in which an upper side of the waveform is clipped. When upsampling is performed on a saturated waveform such as this, waveform distortion caused by ringing occurs in the waveform after the LPF. Here, ringing includes overshoot that occurs during rising of the waveform and undershoot that occurs during falling of the waveform. A local maximum point that is produced as a result of ringing is difficult to differentiate from a peak that is based on a reflected wave from an object, and becomes a factor in erroneous detection in a distance measurement process at a later stage.

JP-A-H08-079558 discloses a technology for suppressing ringing that occurs in a waveform after upsampling. Specifically, a first LPF that has sharp cutoff characteristics and a second LPF that has gradual cutoff characteristics are used. A mixing ratio when signals that are respectively smoothed by the first LPF and the second LPF are mixed is changed based on a degree of changes in rising of a signal.

However, in the conventional technology described in JP-A-H08-079558, ringing cannot be sufficiently suppressed because the output of the LPF that has the sharp cutoff characteristics is mixed. In addition, the LPF that has the sharp cutoff characteristics requires use of numerous multipliers. Therefore, issues arise in that circuitry becomes complex and circuit scale increases.

It is thus desired to provide a technology for suppressing decrease in distance detection accuracy attributed to a waveform after upsampling in a distance measurement apparatus.

An aspect of the present disclosure provides a distance measurement apparatus that includes a light emitter, a light receiver, a scanner, an analog-to-digital (AD) converter, an interpolation processor, and a distance calculator.

The light emitter emits pulse-like light (pulsed light). The light receiver receives reflected light of the light emitted by the light emitter and converts the received light to an electrical signal. The AD converter converts the electrical signal outputted from the light receiver to a digital value at a predetermined sampling rate to generate a conversion data series. The interpolation processor upsamples the conversion data series outputted by the AD converter by inserting interpolation data therein to generate an up-data series. The distance calculator calculates a distance to an object that reflects light using a signal waveform that is indicated by the up-data series generated by the interpolation processor.

The interpolation processor inserts the interpolation data having a predetermined interpolation value between pieces of data belonging to the conversion data series, and smooths the data series in which the interpolation data is inserted using a low-pass filter that has characteristics in which waveform distortion caused by ringing does not occur.

According to this configuration, even when the electrical signal has a saturated waveform, because ringing does not occur in the waveform after upsampling, decrease in distance detection accuracy attributed to the waveform after upsampling can be suppressed.

Embodiments of the present disclosure will hereinafter be described with reference to the drawings.

1. First Embodiment

[1-1. Configuration]

A distance measurement apparatus 1 shown in FIG. 1 is a so-called lidar apparatus that is used so as to be mounted in a vehicle, and performs detection of various objects that are present in the periphery of the vehicle, and the like using laser light. The lidar is also referred to as LIDAR. LIDAR is an abbreviation of Light Detection and Ranging.

The distance measurement apparatus 1 includes a light emitter 2, a scanner 3, a light receiver 4, an AD converter 5, an interpolation processor 6, and a distance calculator 7.

The light emitter 2 outputs laser light that has a single pulse waveform at a predetermined period.

The scanner 3 is configured by a deflecting mirror that rotates or the like. The scanner 3 reflects light that enters from the light emitter 2 with the deflecting mirror and emits the light in a direction that is based on a rotation angle of the deflecting mirror. As a result, the scanner 3 scans a predetermined scanning area with the light. In addition, the scanner 3 reflects light that arrives from a direction in which the light in the scanning area is emitted with the deflecting mirror and guides the light to the light receiver 4.

The light receiver 4 receives the light from the scanner 3 and outputs a light reception signal based on light reception intensity. The light receiver 4 includes a light receiving element, a transimpedance amplifier (hereafter, TIA), an amplifying circuit, a low-pass filter (hereafter, LPF), and the like. For example, the light receiving element includes an avalanche photodiode (hereafter, APD) and outputs a current signal that is based on the intensity of the received light. The TIA converts the current signal from the light receiving element to a voltage signal. The amplifying circuit amplifies the voltage signal obtained through conversion by the TIA. Here, the amplifying circuit may have a fixed gain or a variable gain. In addition, in the distance measurement apparatus 1, light signals of a wide dynamic range are required to be received. To enable detection of a light signal that has low intensity, the gain of the amplifying circuit is required to be set to a value that is fairly high. As a result, when a light signal that has a certain degree of intensity or greater is received, the amplifying circuit may become saturated. The LPF cuts frequency components that are greater than a frequency that is twice a sampling rate of the AD converter 5, from the voltage signal amplified by the amplifying circuit.

The AD converter 5 samples the light reception signals outputted from the light receiver 4 at a predetermined sampling rate and generates a series of digital data (hereafter, a conversion data series).

The interpolation processor 6 performs an interpolation process that is referred to as upsampling on the conversion data series. Upsampling is a process in which N−1 pieces of data are interpolated between each of the pieces of data belonging to the conversion data series, thereby converting the conversion data series to a data series that has an N-fold sampling rate. The data series that has undergone upsampling by the interpolation processor 6 is referred to, hereafter, as an up-data series (upsampled-data series). In addition, the interpolation processor 6 operates based on an operation clock that is used in the AD converter 5, that is, an operation clock that has a clock rate that is the same as the sampling rate.

The distance calculator 7 identifies a light emission timing at the light emitter 2. The distance calculator 7 also identifies a light reception timing from a signal waveform that is indicated by the up-data series outputted from the interpolation processor 6. The distance calculator 7 then calculates a distance to an object that reflects the light based on an amount of time from the light emission timing at the light emitter 2 to the light reception timing.

Figure 2:
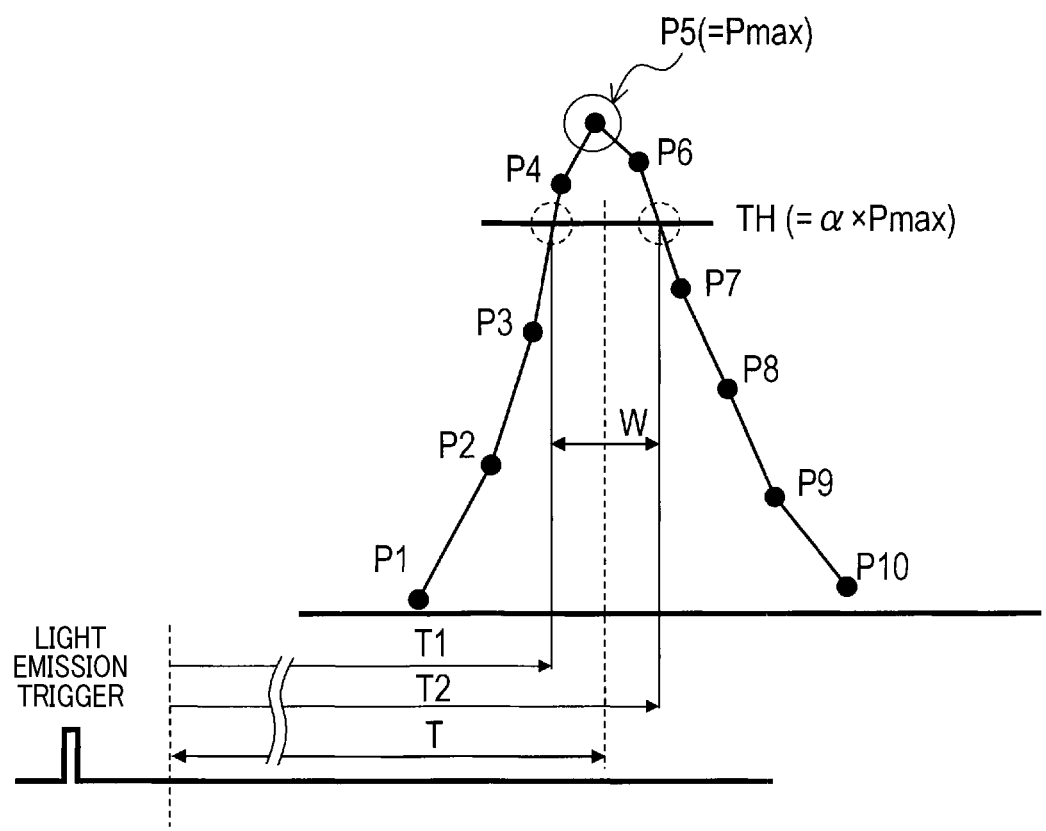
FIG. 2 is an explanatory diagram illustrating an overview of a process in a distance calculator.

Specifically, as shown in FIG. 2, first, a peak waveform is extracted based on the up-data series. A process below is performed for each peak waveform that is extracted. In addition, a threshold TH that is α-fold of a maximum value Pmax of the data in the peak waveform is set. In FIG. 2, data P5 is the maximum value Pmax. In addition, α is a real number that satisfies 0<α<1. For example, α=0.625 or the like.

Next, a pair of data that sandwiches the threshold TH is extracted for each of a rising waveform and a falling waveform of the peak. In FIG. 2, data P3 and P4 are extracted from the rising waveform. Data P6 and P7 are extracted from the falling waveform.

Next, based on the extracted pairs of data, a timing at which the threshold TH is crossed in the rising waveform and a timing at which the threshold TH is crossed in the falling waveform are estimated. For example, this estimation is performed under an assumption that the waveform between the extracted pairs of data changes linearly. Then, time T1 from the light emission timing to the timing estimated in the rising waveform and time T2 from the light emission timing to the timing estimated in the falling waveform are calculated.

Through use of time T1 and T2, a pulse width W is calculated based on expression (1) and time T from the light emission timing to the light reception timing is calculated based on (2).

$$W = T2 - T1 \quad (1)$$

$$T = (T1 + T2)/2 \quad (2)$$

Finally, with the calculated time T as the amount of time required for the light to travel to and from the object that reflects the light, the distance to the object is calculated.

[1-2. Interpolation Processor]

Figure 3:
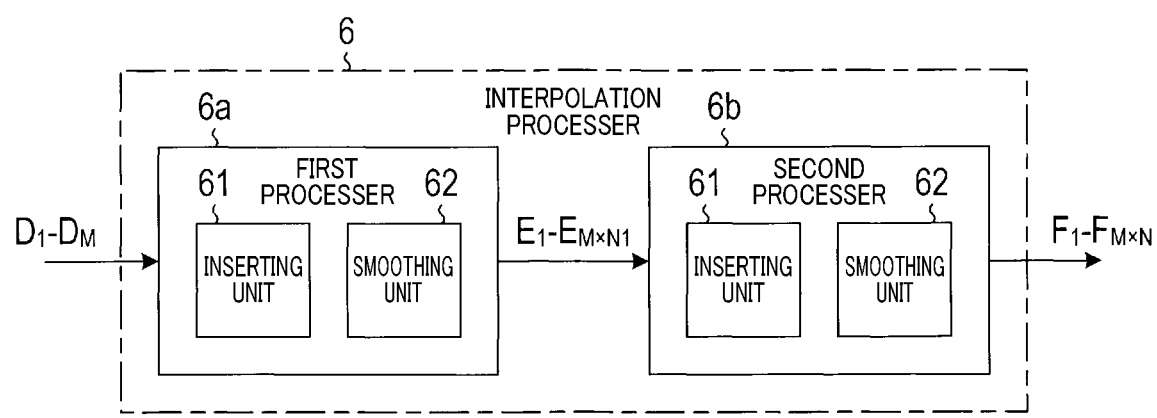
FIG. 3 is a block diagram illustrating a configuration of an interpolation processor according to a first embodiment.

As shown in FIG. 3, the interpolation processor 6 includes a first processor 6a and a second processor 6b.

The first processor 6a and the second processor 6b both perform upsampling. A reason for this is that, if identical performance is implemented, circuit scale is more suppressed by performance being implemented in a plurality of stages rather than by a single upsampling.

The first processor 6a and the second processor 6b both include an inserting unit 61 and a smoothing unit 62.

[1-2-1. Inserting Unit]

Figure 4:
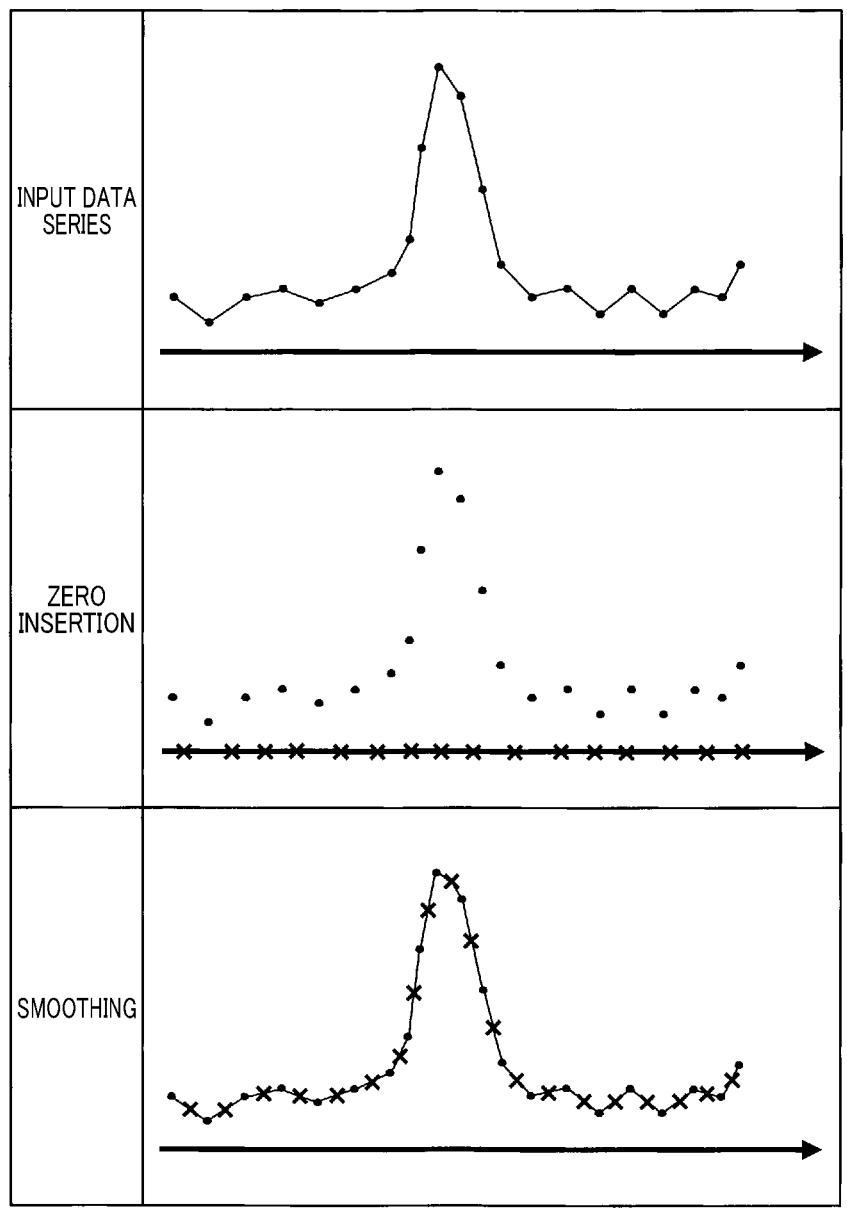
FIG. 4 is an explanatory diagram illustrating an overview of a process in the interpolation processor.

As shown in an upper part and a middle part of FIG. 4, the inserting unit 61 inserts interpolation data into an input data series. When the sampling rate is made N-fold, N−1 pieces of interpolation data are inserted between each of the pieces of data. FIG. 4 shows a case in which N=2. Hereafter, a length of the input data series to be subjected to upsampling is M.

Figure 5:
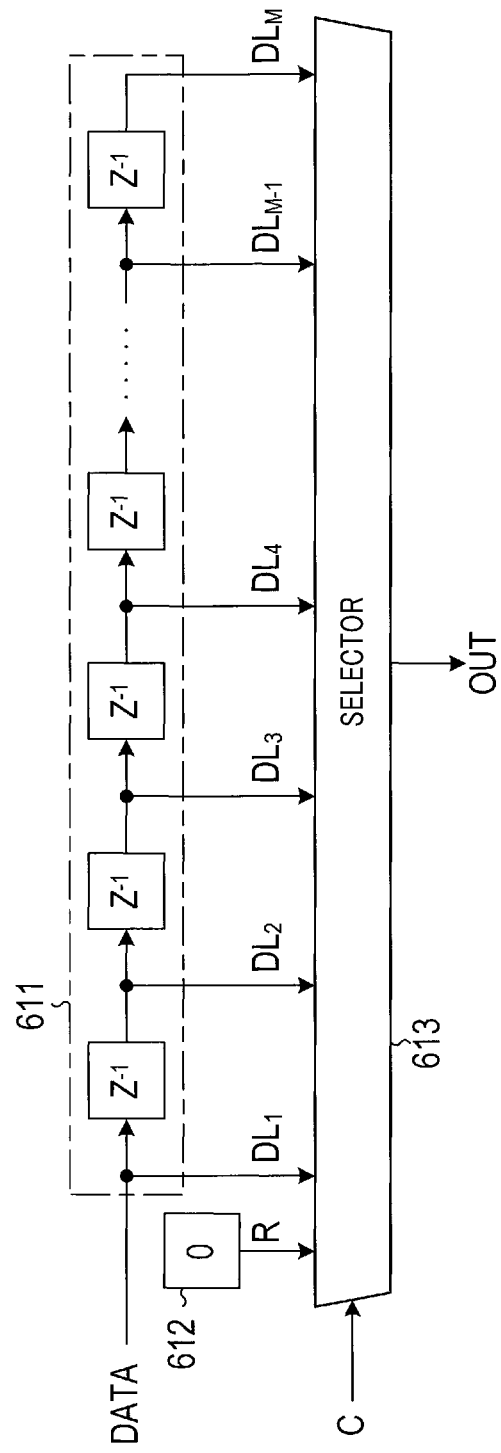
FIG. 5 is a circuit diagram illustrating a configuration of an inserting unit.

For example, as shown in FIG. 5, the inserting unit 61 includes a delaying unit 611, an interpolation value register 612, and a selector 613. The delaying unit 611 includes an M−1 delay elements that are connected in series. Each delay element delays the input data by a single clock based on the operation clock. Hereafter, input of a delay element in an initial stage is DL1. Output of a delay element in an m-th stage is DLm. Here, m may be an integer from 2 to M.

The interpolation value register 612 is a register in which an interpolation value that is a value of the interpolation data is set. Although the interpolation value may be any type of value, zero is used herein.

The selector 613 selects any of an output R of the interpolation value register 612 and the outputs DL1 to DLm from the delay unit 611, and successively outputs the selected output, based on a count value C that is a count of the number of pieces of data that has been inputted, based on the operation clock.

Figure 6:
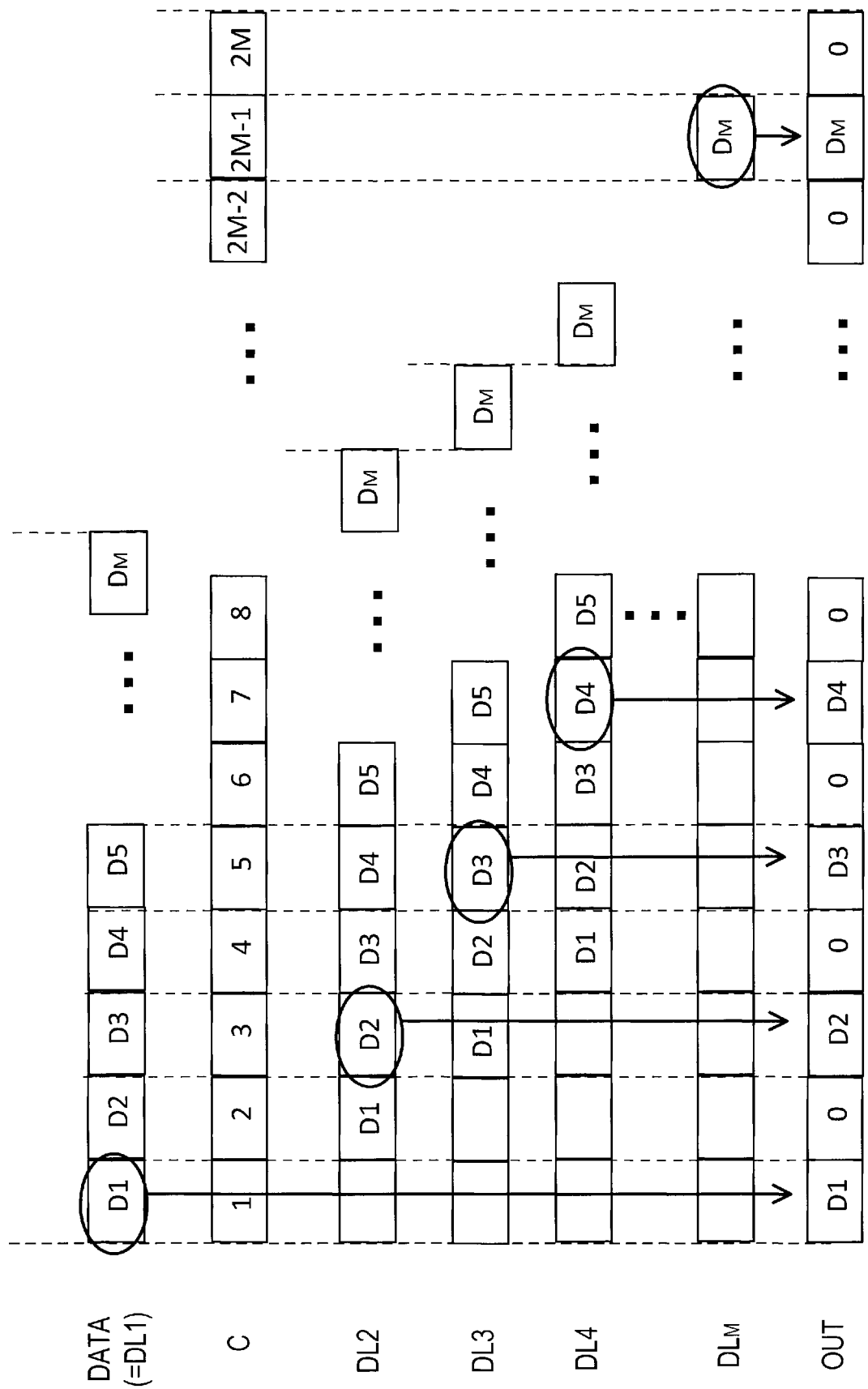
FIG. 6 is a timing chart illustrating an operation of the inserting unit.

A specific of the inserting unit 61 will be described with reference to a timing chart in FIG. 6.

When the count value C is an odd number (that is, C=1, 3, 5, . . . ), with m=(C+1)/2, the selector 613 selects the output DLm from the delaying unit 611. When the count value C is an even number (that is, C=2, 4, 6, . . . ), the selector 613 selects the output R of the interpolation value register 612.

As a result, an output data series OUT that has 2M pieces of data is generated. In the output data series OUT, the interpolation data of which the value is zero is inserted every other piece of data, in an input data series DATA that has M pieces of data.

[1-2-2. Smoothing Unit]

The smoothing unit 62 performs an LPF process on the output data series OUT of the inserting unit 61, that is, the data series to which zero insertion has been performed, shown in the middle part of FIG. 4, and thereby generates a data series that expresses a signal waveform that has been smoothed. The LPF that is used herein is a moving average filter that is a low-pass filter that has characteristics in which waveform distortion caused by ringing does not occur at all. Here, ringing includes overshoot that occurs during rising of a waveform and undershoot that occurs during falling of a waveform. Moreover, the smoothing unit 62 is not limited to the moving average filter. A CIC filter, a 1-2-1 filter, and the like may be used. CIC is an abbreviation of Cascaded Integrator-comb. 1-2-1 filter is a FIR filter of which a ratio of filter coefficients is 1:2:1.

Figure 7:
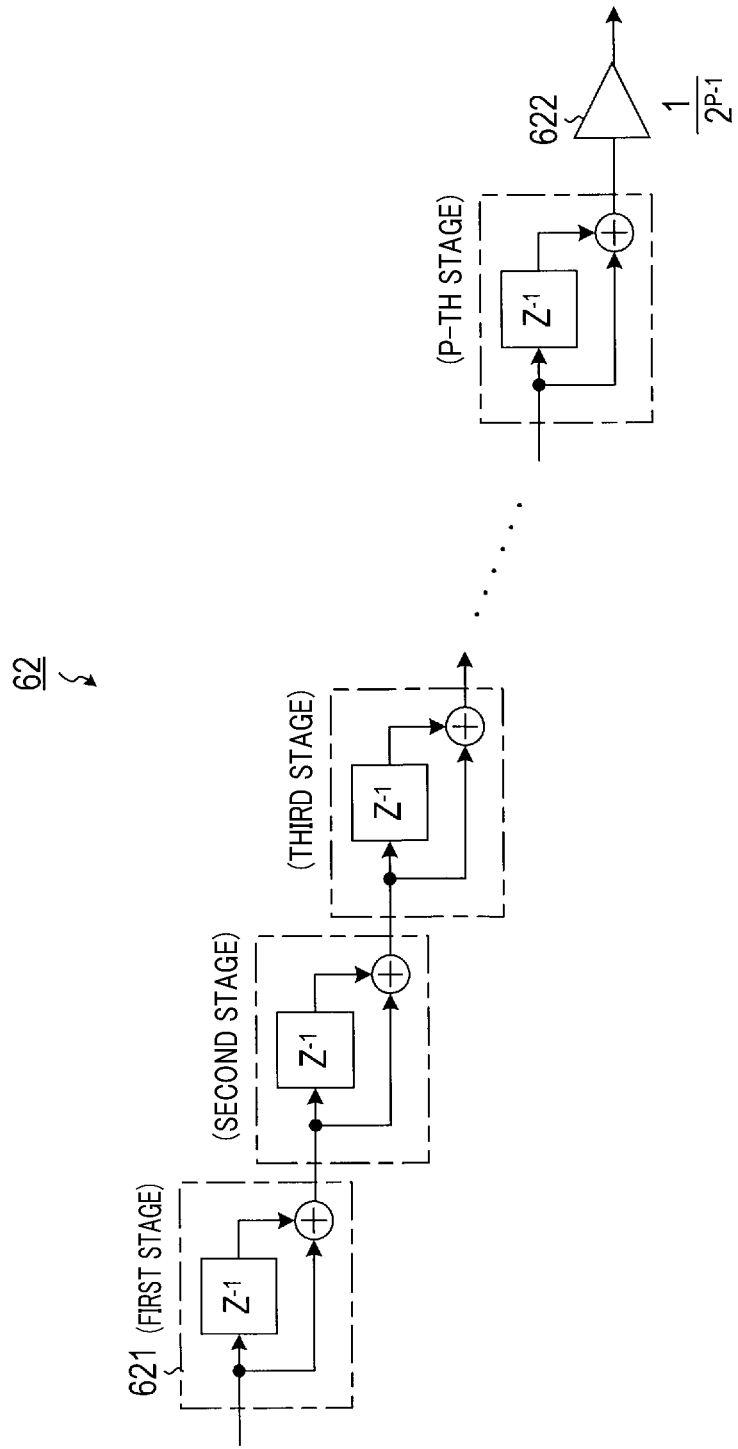
FIG. 7 is a circuit diagram illustrating a configuration of a smoothing unit.

As shown in FIG. 7, as the moving average filter, a P-stage, Q-times average filter in which unit blocks 621 are connected in series in P stages is used. The unit block 621 calculates the moving average of Q pieces of continuous data. FIG. 7 shows an example of a case in which the unit block 621 calculates the moving average of Q=2 pieces of data. The unit block 621 is configured by an adder and a delay element, without use of a multiplier.

A gain adjusting circuit 622 is provided at the output of the unit block 621 in a last stage. The gain adjusting circuit 22 adjusts the gain such that an average value of the data series before zero insertion and an average value of the data series after zero insertion are equal. Here, zero insertion is performed at a proportion of 1 to 1. When the moving average is calculated as is, the gain becomes ½. Therefore, in the gain adjusting circuit, the gain is set to $\frac{1}{2}^{P-1}$ that is two-fold of a gain $\frac{1}{2}^{P}$ that is used during ordinary calculation of the moving average. The gain adjusting circuit 622 performs division. When the unit block 621 performs averaging twice, the division is by the power of 2. Thus, a complicated divider is not required, and the division can be implemented by a shift operation in the register.

When a multiplying factor N of upsampling of the overall interpolation processor 6 is expressed by N=N1+N2, the multiplying factor N1 is assigned to the first processor 6a and the multiplying factor N2 is assigned to the second processor 6b. To simplify circuit configuration, N1 and N2 may both be powers of two. In addition, parameters P and Q of the moving average filter that configures the smoothing unit 62 may be set to the same values in the first processor 6a and the second processor 6b, or may be set to differing values.

[1-2-3. Operation of the Interpolation Processor]

Figure 8:
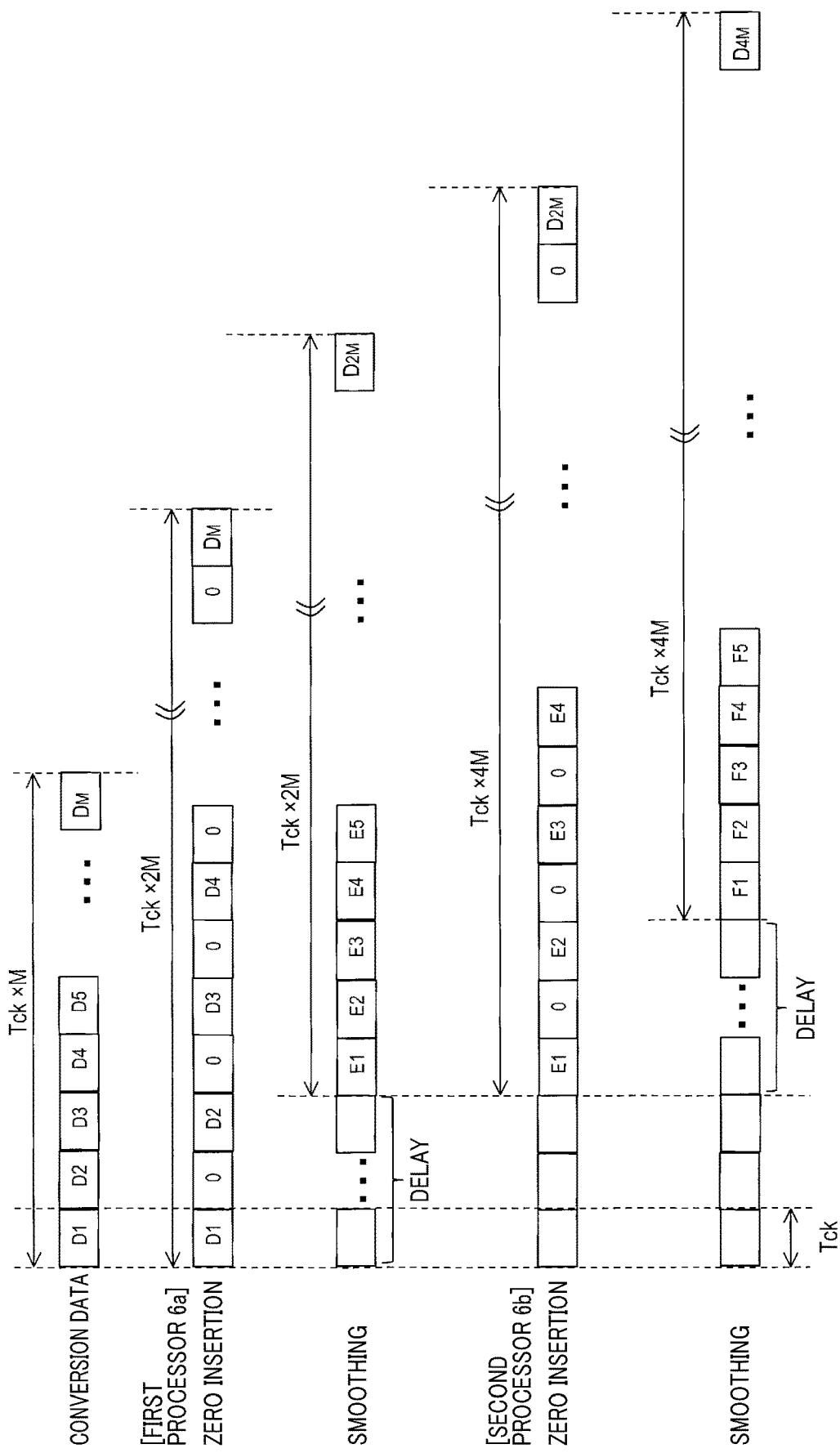
FIG. 8 is a timing chart illustrating an operation of the smoothing unit.

An operation of the interpolation processor 6 when N1=N2=2 will be described with reference to FIG. 8.

The inserting unit 61 of the first processor 6a performs zero insertion delay. However, because the same operation clock as that of the AD converter 5 is used in the interpolation processor 6, the amount of time required for processing is two-fold of time M×Tck that is required for sampling. Tck is a period of the operation clock. In addition, the smoothing unit 62 delays processing by P×(Q−1) clock that is required from when a first piece of data is inputted until output is started.

In a similar manner, the inserting unit 61 of the second processor 6b performs zero insertion without delay on the data series that is outputted by the first processor 6a. However, the amount of time required for processing is four-fold of the time required for sampling. In addition, the smoothing unit 62 further delays processing by P×(Q−1) clock that is required from when a first piece of data is inputted until output is started.

[1-2-4. Design]

Next, setting of P1 and P2 will be described, where P1 is the number of stages of the unit blocks in the smoothing unit 62 of the first processor 6a, and P2 is the number of stages of the unit blocks in the smoothing unit 62 of the second processor 6b. Here, as the numbers of stages P1 and P2 increase, detection accuracy regarding distance improves. However, circuit scale and processing delay increase.

Figure 9:
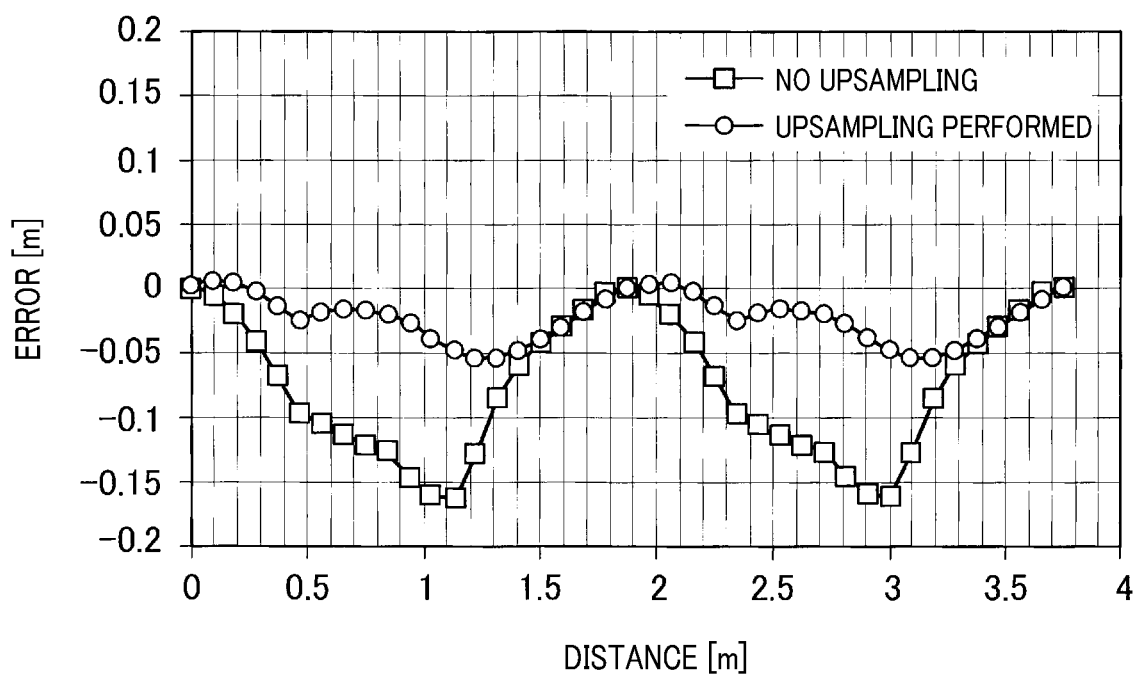
FIG. 9 is a graph illustrating errors in calculated distance.

FIG. 9 shows results of an error (hereafter, distance error) between a distance to an object that is calculated based on the light reception timing extracted from the conversion data series and the up-data series, and an actual distance to the object that has been determined through simulation with changes being made to the distance to the object.

As shown in FIG. 9, the distance error is cyclic, and error decreases as a result of upsampling being performed.

Figure 10:
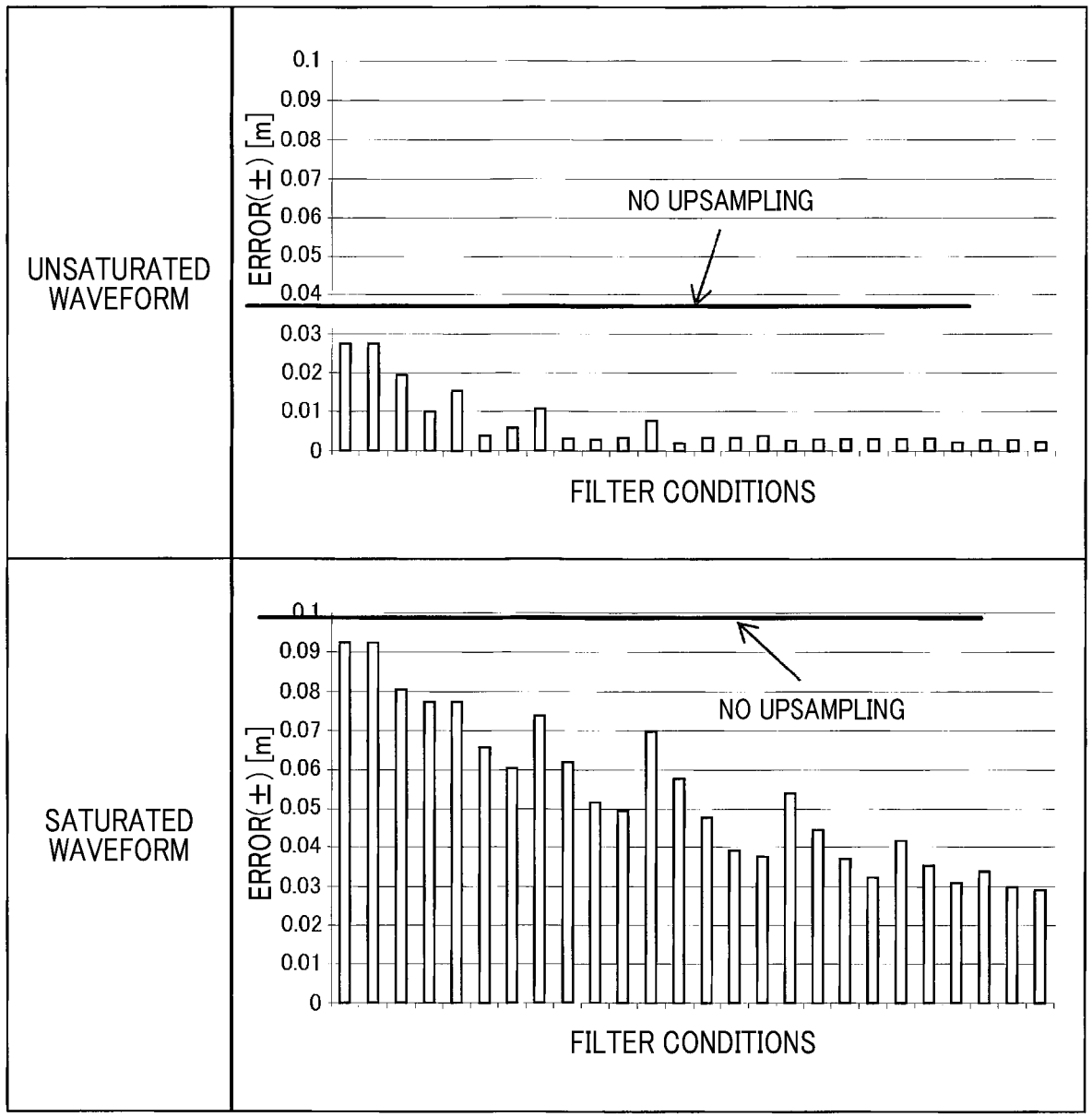
FIG. 10 is graphs illustrating simulation results used in designing of the interpolation processor.

FIG. 10 is results of a maximum value of the distance error calculated for various combinations of (P1, P2) (corresponding to filter conditions). When a case in which the light reception signal has an unsaturated waveform and a case in which the light reception signal has a saturated waveform are compared, the distance error is greater when the light reception signal has a saturated waveform than when the light reception signal has an unsaturated waveform. Even when a total number of stages, P1+P2, is the same, the distance error changes depending on the manner of distribution of the stages. The distance error is preferably small. However, the total number of stages, P1+P2, also being minimized is more preferable.

In addition, pulse width, signal-to-noise ratio (S/N), and the like before and after upsampling are also correlated with the total number of stages, P1+P2. As the total number of stages, P1+P2, increases, the increase in pulse width tends to become greater and the S/N tends to decrease. In addition, when the total number of stages, P1+P2, is the same, the distance error tends to increase as the number of stages P1 increases.

The numbers of stages, P1 and P2, are set based on these simulation results, such that the distance error, the increase in pulse width, and the S/N meet required performance and the total number of stages is minimized.

[1-3. Effects]

According to the first embodiment described in detail above, the following effects are achieved.

(1a) In the smoothing unit 62 of the interpolation processor 6, a LPF that has characteristics in which ringing does not occur at all in step response is used. Therefore, even when the light reception signal has a saturated waveform, ringing does not occur in the waveform after upsampling. Decrease in distance detection accuracy attributed to the waveform after upsampling can be suppressed.

(1b) Rather than operating at the sampling rate after upsampling, the interpolation processor 6 operates but based on the same operation clock as the AD converter 5. Therefore, both power consumption and heat generation can be reduced.

2. Second Embodiment

[2-1. Differences with the First Embodiment]

A basic configuration according to a second embodiment is similar to that according to the first embodiment. Therefore, differences will be described below. Here, reference numbers that are the same as those according to the first embodiment indicate identical configurations. Descriptions given above are referenced.

According to the above-described first embodiment, the interpolation processor 6 performs the processes on the data series to be interpolated in series. In contrast, the second embodiment differs from the first embodiment in which the interpolation processor 6 performs the processes on the data series to be interpolated in parallel.

[2-2. Interpolation Processor]

Figure 11:
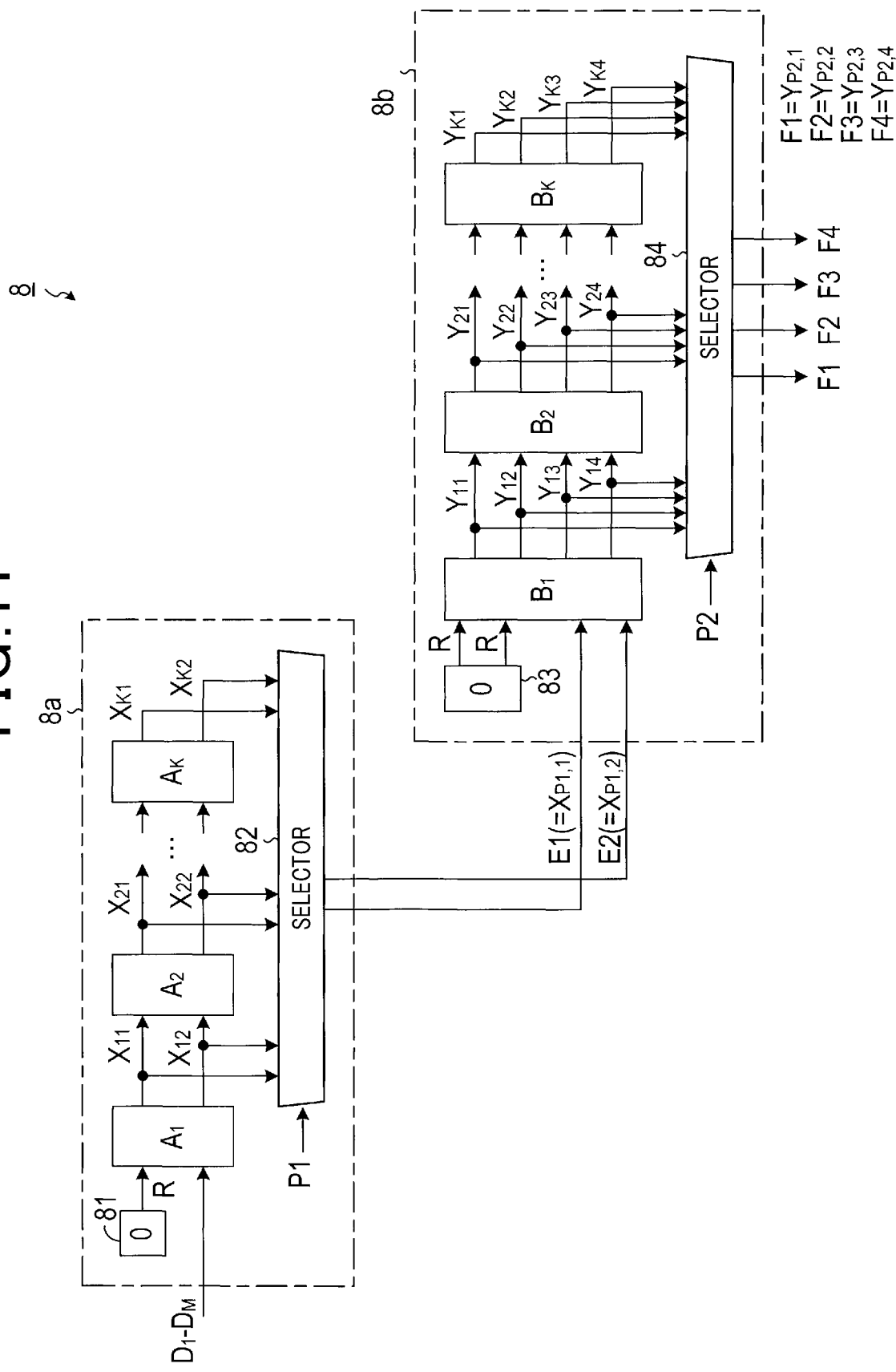
FIG. 11 is a block diagram illustrating a configuration of an interpolation processor according to a second embodiment.

Next, as shown in FIG. 11, an interpolation processor 8 according to the second embodiment includes a first processor 8a and a second processor 8b.

The first processor 8a includes an interpolation value register 81, a K unit blocks A1 to AK, and a selector 82. The interpolation value register 81 sets the interpolation value R. R=0, herein. The unit blocks A1 to AK are two-input, two-output circuit blocks and are connected in series.

Figure 12:
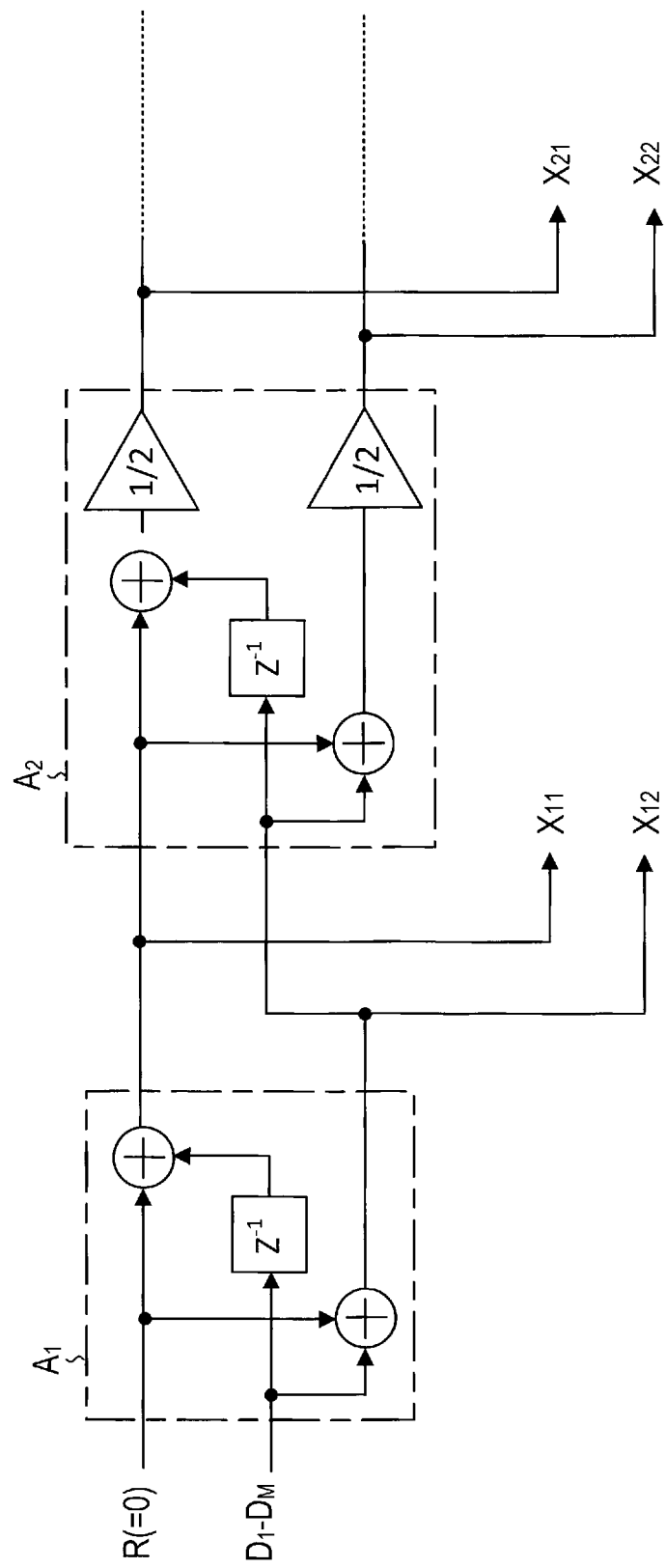
FIG. 12 is a circuit diagram illustrating a configuration of a first processor according to the second embodiment.

As shown in FIG. 12, the interpolation value R stored in the interpolation value register 81 and a conversion data series D1 to DM are inputted the unit block A1 of an initial stage. The unit block A1 is configured by two adders and a delay element. The unit block A1 performs, in two parallel processes, insertion of the interpolation data that has the interpolation value R into the conversion data series $D_1$ to $D_M$, and calculation of the moving average of two pieces of continuous data in the data series in which the interpolation data is inserted. The unit block A1 then outputs data X11 and X12 of which the gain is two-fold. The gain is made two-fold for the same reason that the gain of the output of the smoothing unit 62 is made two-fold according to the first embodiment.

Each unit block Ai, where i=2, 3, . . . K, of second and subsequent stages has a similar configuration. Outputs Xi-1,1 and Xi-1,2 of a unit block Ai-1 of a previous stage is inputted to the unit block Ai. The unit block Ai includes two dividers that respectively halve two output values, in addition to the configuration of the unit block A1. The unit block Ai outputs data Xi1 and Xi2 that are results obtained by performing moving average in two parallel processes on two pieces of continuous data in the data series expressed by the output of the previous stage.

When the number of stages of the moving average filter used in the first processor 8a is P1, the selector 82 selects data XP1,1 and XP1,2, and sets the data XP1,1 and XP1,2 as input data E1 and E2 to the second processor 8b.

The second processor 8b includes a two-output interpolation value register 83, a K unit blocks B1 to BK, and a selector 84. In a manner similar to the interpolation register 81, the interpolation value register 83 sets the interpolation value R that is the value of the interpolation data. R=0, herein. The unit blocks B1 to BK are four-input, four-output circuit blocks and are connected in series.

Figure 13:
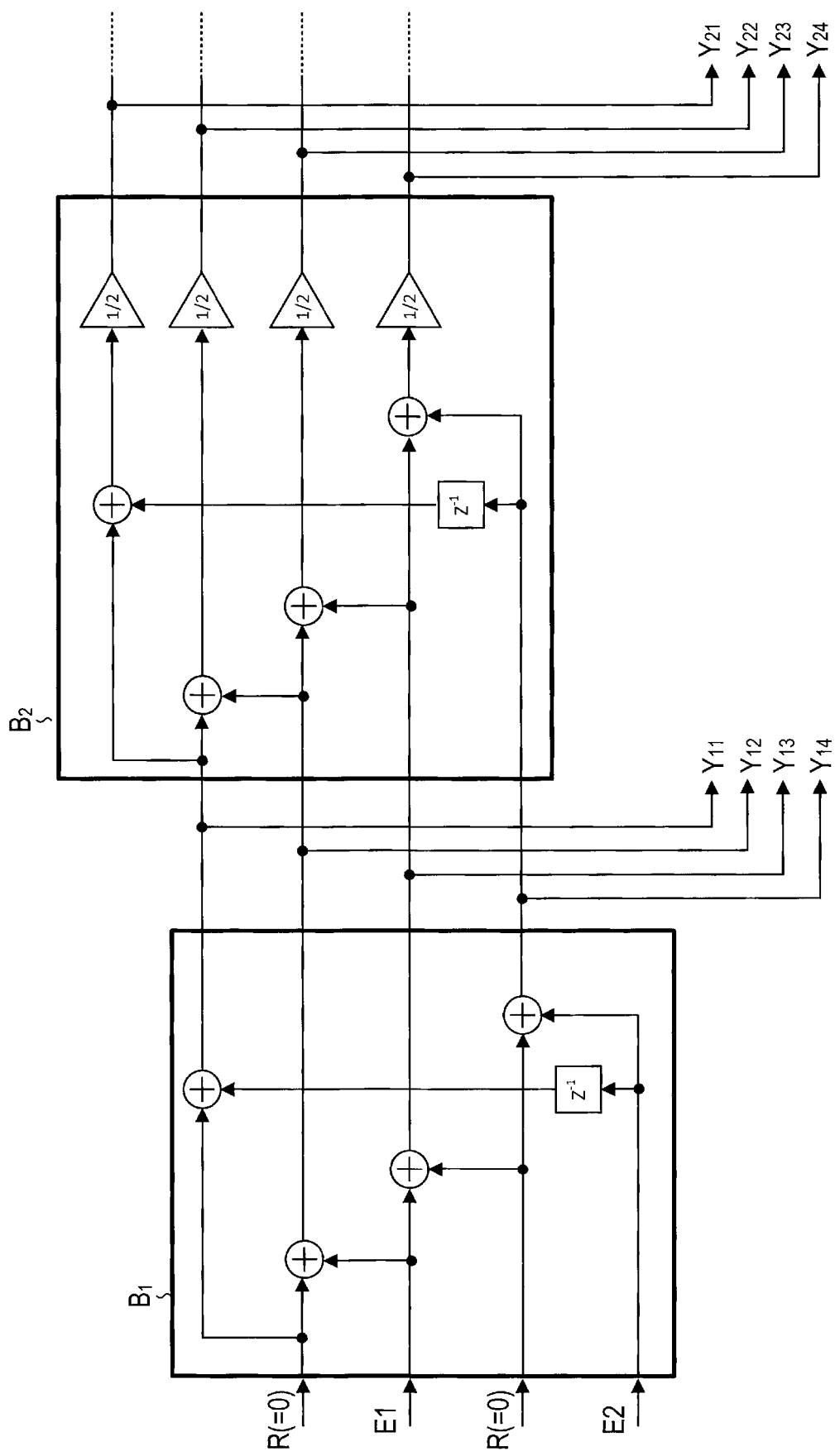
FIG. 13 is a circuit diagram illustrating a configuration of a second processor according to the second embodiment.

As shown in FIG. 13, the interpolation value R stored in the interpolation value register 83 and the data E1 and E2 supplied from the first processor 8a are inputted the unit block B1 of an initial stage. The unit block B1 is configured by four adders and a delay element. The unit block B1 performs, in four parallels, insertion of the interpolation data into a data series that has been upsampled by P1-fold, expressed by the data E1 and E2, the conversion data series $D_1$ to $D_M$, and calculation of the moving average of two pieces of continuous data in the data series in which the interpolation data is inserted. The unit block $B_1$ then outputs data $Y_{11}$, $Y_{12}$, $Y_{13}$, and $Y_{14}$ of which the gain is two-fold. The gain is made two-fold for the same reason that the gain of the output of the smoothing unit 62 is made two-fold according to the first embodiment.

Each unit block Bi, where i=2, 3, . . . K, of second and subsequent stages has a similar configuration. Outputs Yi-1,1, Yi-1,2, Yi-1,3 and Yi-1,4 of a unit block Bi-1 of a previous stage is inputted to the unit block Bi. The unit block Bi includes four dividers that respectively halve four output values, in addition to the configuration of the unit block B1. The unit block Bi outputs data Yi1, Yi2, Yi3, and Yi4 that are results obtained by performing moving average in four parallels on two pieces of continuous data in the data series expressed by the output of the previous stage.

When the number of stages of the moving average filter used in the second processor 8b is P2, the selector 84 selects data YP2,1, YP2,2, YP2,3, and YP2,4, and outputs the data YP2,1, YP2,2, YP2,3, and YP2,4 as data F1, F2, F3, and F4. This data that is in four parallels being rearranged into a series forms the up-data series supplied to the distance calculator 7.

[2-3. Operation of the Interpolation Processor]

Figure 14:
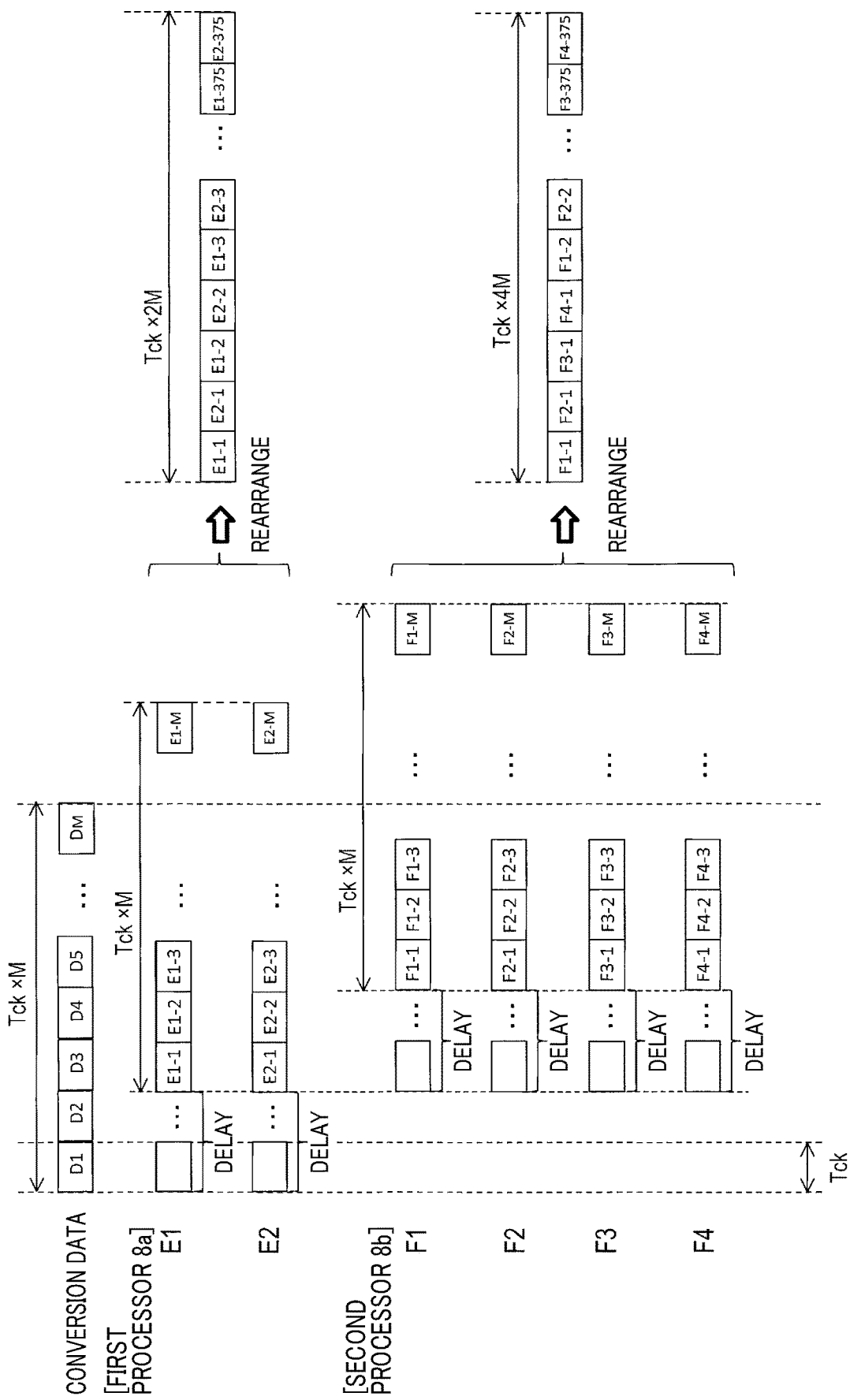
FIG. 14 is a timing chart illustrating an operation of the interpolation processor.

An operation of the interpolation processor 8 will be described with reference to FIG. 14.

The first processor 8a performs zero insertion and smoothing, collectively and in two parallels. Therefore, regardless of the first processor 8a operating based on the same operation clock as the AD converter 5, the amount of time required from start to end of the output of the output E1 and E2 is the same length as the time M×Tck required for sampling. However, a delay based on the number of stages P1 that is used occurs from when data is inputted to the first processor 8a until the output E1 and E2 are outputted.

In a similar manner, the second processor 8b performs zero insertion and smoothing, collectively and in four parallels. Therefore, the amount of time required from start to end of the output of the output F1 to F4 is the same length as the time M×Tck required for sampling. However, a delay based on the number of stages P2 that is used occurs from when data is inputted to the second processor 8b until the output F1 to F4 are outputted.

[2-4. Effects]

According to the second embodiment described in detail above, the above-described effects (1a) and (1b) according to the first embodiment are achieved. In addition, the effects below are achieved.

(2a) The interpolation processor 8 performs parallel processing. Therefore, regardless of the interpolation processor 8 using the same operation clock as the AD converter 5, the calculation for generating the up-data series that has N-fold of the number of data in the conversion data series from the conversion data series can be implemented in a processing time that is about an amount of time obtained by delay times in the unit blocks A and B being added to the sampling time. That is, the processing time in the interpolation processor 8 can be eliminated.

3. Other Embodiments

The embodiments of the present disclosure are described above. However, the present disclosure is not limited to the above-described embodiments. Various modifications are possible.

(3a) According to the above-described embodiment, the interpolation processor 6 performs the interpolation process in two stages. However, the interpolation process may be performed in three or more stages. In addition, the interpolation process may be performed in a single stage rather than being performed in a plurality of stages.

(3b) A plurality of functions provided by a single constituent element according to the above-described embodiments may be implemented by a plurality of constituent elements. A single function provided by a single constituent element may be implemented by a plurality of constituent elements. In addition, a plurality of functions provided by a plurality of constituent elements may be implemented by a single constituent element. A single function provided by a plurality of constituent elements may be implemented by a single constituent element. Furthermore, a part of a configuration according to the above-described embodiments may be omitted. Moreover, at least a part of a configuration according to an above-described embodiment may be added to or replace a configuration according to another of the above-described embodiments.

(3c) The present disclosure can also be implemented by various modes in addition to the above-described distance measurement apparatus 1, such as a system of which the distance measurement apparatus 1 is a constituent element.

What is claimed is:

1. A distance measurement apparatus comprising:
a light emitter that emits pulse-like light;
a light receiver that receives reflected light of the light emitted by the light emitter and converts the received light to an electrical signal;
an analog-to-digital (AD) converter that converts the electrical signal outputted from the light receiver to a digital value at a predetermined sampling rate to generate a conversion data series;
an interpolation processor that upsamples the conversion data series outputted by the AD converter by inserting interpolation data therein to generate an up-data series; and
a distance calculator that calculates a distance to an object that reflects light using a signal waveform that is indicated by the up-data series generated by the interpolation processor, wherein:
the interpolation processor is configured to perform upsampling of the conversion data series in a plurality of stages, and at each stage, insert the interpolation data having a predetermined interpolation value between pieces of data belonging to the conversion data series, and smooth the signal waveform indicated by the data series in which the interpolation data is inserted using a low-pass filter that has characteristics in which waveform distortion caused by ringing does not occur.

2. The distance measurement apparatus according to claim 1, wherein:
the low-pass filter is configured using an adder and a delay element, without use of a multiplier.

3. The distance measurement apparatus according to claim 2, wherein:
the low-pass filter comprises at least one of a moving average filter, a cascaded integrator-comb filter, and a 1-2-1 filter.

4. The distance measurement apparatus according to claim 1, wherein:
the interpolation processor is configured to operate based on a same operation clock as the AD converter.

5. The distance measurement apparatus according to claim 4, wherein:
the interpolation processor is configured to process upsampling to make the sampling rate N-fold, N pieces of data at a time in parallel, N being an integer.

6. The distance measurement apparatus according to claim 1, wherein:

the light receiver includes an amplifying circuit that has a fixed gain or a variable gain.

7. The distance measurement apparatus according to claim 1, further comprising:
a scanner that performs scanning toward a predetermined scanning area with the light emitted by the light emitter and guides, to the light receiver, light that arrives from a direction in which the light is emitted.

8. A distance measurement apparatus comprising:
a light emitter that emits pulse-like light;
a light receiver that receives reflected light of the light emitted by the light emitter and converts the received light to an electrical signal;
an analog-to-digital (AD) converter that converts the electrical signal outputted from the light receiver to a digital value at a predetermined sampling rate to generate a conversion data series;
an interpolation processor that upsamples the conversion data series outputted by the AD converter by inserting interpolation data therein to generate an up-data series; and
a distance calculator that calculates a distance to an object that reflects light using a signal waveform that is indicated by the up-data series generated by the interpolation processor, wherein:
the interpolation processor is configured to be directly driven by a same operation clock as the AD converter insert the interpolation data having a predetermined interpolation value between pieces of data belonging to the conversion data series, and smooth the signal waveform indicated by the data series in which the interpolation data is inserted using a low-pass filter that has characteristics in which waveform distortion caused by ringing does not occur.

9. The distance measurement apparatus according to claim 8, wherein:
the interpolation processor is configured to process upsampling to make the sampling rate N-fold, N pieces of data at a time in parallel, N being an integer.

10. The distance measurement apparatus according to claim 9, wherein:
the light receiver includes an amplifying circuit that has a fixed gain or a variable gain.

11. The distance measurement apparatus according to claim 10, further comprising:
a scanner that performs scanning toward a predetermined scanning area with the light emitted by the light emitter and guides, to the light receiver, light that arrives from a direction in which the light is emitted.

12. The distance measurement apparatus according to claim 8, wherein:
the low-pass filter is configured using an adder and a delay element, without use of a multiplier.

13. The distance measurement apparatus according to claim 8, wherein:
the low-pass filter comprises at least one of a moving average filter, a cascaded integrator-comb filter, and a 1-2-1 filter.

14. A distance measurement apparatus comprising:
a light emitter that emits pulse-like light;
a light receiver that receives reflected light of the light emitted by the light emitter and converts the received light to an electrical signal;
an analog-to-digital (AD) converter that converts the electrical signal outputted from the light receiver to a digital value at a predetermined sampling rate to generate a conversion data series;
an interpolation processor that upsamples the conversion data series outputted by the AD converter by inserting interpolation data therein to generate an up-data series; and
a distance calculator that calculates a distance to an object that reflects light using a signal waveform that is indicated by the up-data series generated by the interpolation processor, wherein:
the interpolation processor includes a plurality of unit blocks,
the plurality of unit blocks are two-input, two-output circuit blocks and are connected in series in a plurality of stages from an initial stage to second and subsequent stages,
the unit block of the initial stage is configured to receive a predetermined interpolation value and the conversion data series, and perform, in parallel processing, insertion of the interpolation data that has the interpolation value into the conversion data series, and calculation of moving average of two pieces of continuous data in data series in which the predetermined interpolation data is inserted to generate two outputs, and
the unit blocks of the second and subsequent stages are configured to receive two outputs from a unit block of a previous stage, perform, in parallel processing, calculation of moving average of two pieces of continuous data in data series expressed by the two outputs of the unit block of the previous stage and multiply respective calculation results by ½ to generate two outputs.

15. The distance measurement apparatus according to claim 14, wherein:
the interpolation processor is configured to perform upsampling in a plurality of stages.

16. The distance measurement apparatus according to claim 14, wherein:
the light receiver includes an amplifying circuit that has a fixed gain or a variable gain.

17. The distance measurement apparatus according to claim 14, further comprising:
a scanner that performs scanning toward a predetermined scanning area with the light emitted by the light emitter and guides, to the light receiver, light that arrives from a direction in which the light is emitted.

* * * * *